(12) United States Patent
Ohama et al.

(10) Patent No.: US 6,590,984 B2
(45) Date of Patent: Jul. 8, 2003

(54) SOUND QUALITY REGULATION APPARATUS

(75) Inventors: Shigeji Ohama, Kyoto (JP); Hiroyuki Saito, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 10/058,860

(22) Filed: Jan. 28, 2002

(65) Prior Publication Data

US 2002/0102001 A1 Aug. 1, 2002

(30) Foreign Application Priority Data

Jan. 29, 2001 (JP) ........................ 2001-019947

(51) Int. Cl.$^7$ ............................ H04R 29/00; H03H 7/00
(52) U.S. Cl. ..................... 381/56; 381/123; 333/173; 327/554
(58) Field of Search ................. 381/56, 58, 61, 381/98, 99, 97, 100, 101, 102, 103, 104, 107, 109, 120, 123, 94.3; 333/173; 330/9; 327/554, 337

(56) References Cited

U.S. PATENT DOCUMENTS

| 4,453,143 A | * | 6/1984 | Bennett | 333/173 |
| 5,039,963 A | * | 8/1991 | Fischer | 333/173 |
| 5,953,430 A | * | 9/1999 | Kirchlechner et al. | 381/102 |
| 6,411,717 B1 | * | 6/2002 | Lubbe et al. | 381/98 |
| 6,509,791 B2 | * | 1/2003 | Segawa et al. | 327/554 |

FOREIGN PATENT DOCUMENTS

JP 10-233653 9/1998

* cited by examiner

*Primary Examiner*—Xu Mei
(74) *Attorney, Agent, or Firm*—Hogan & Harston LLP

(57) ABSTRACT

The sound quality regulation apparatus has one attenuation unit and one amplification unit connected in series in this order in the signal line of the apparatus. The output of the attenuation unit is fed to a multiplicity of sound regulators associated with the split frequency bands of the input signal. Each sound regulator includes a switched capacity filter and a selector for selectively supplying the output of the sound regulator to either the attenuation unit, amplification unit, or none of these units. The sound quality regulation apparatus is thus capable of individually attenuating, enhancing, or not changing split frequency bands of the input signal.

9 Claims, 7 Drawing Sheets

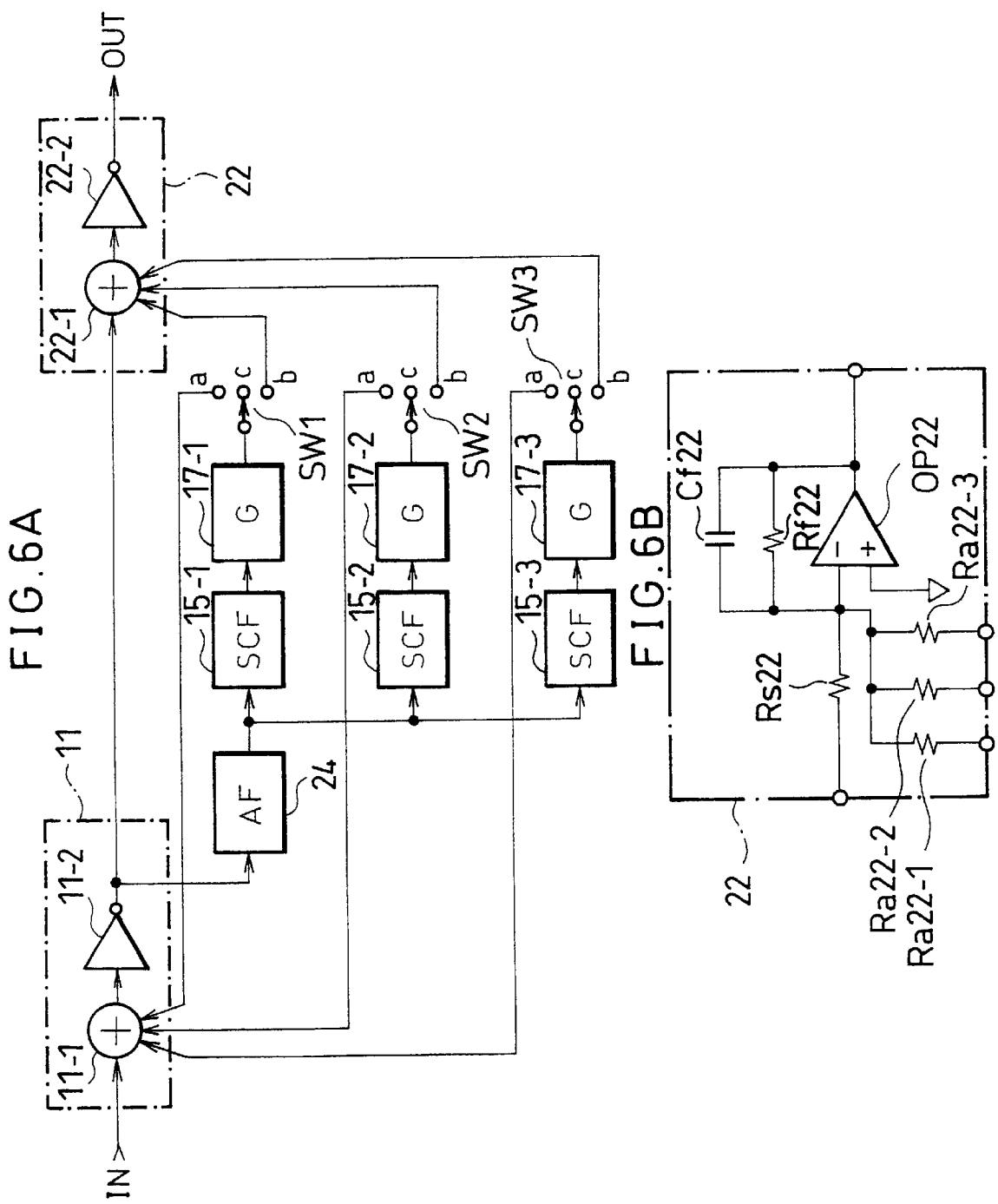

SOUND QUALITY REGULATION APPARATUS

FIELD OF THE INVENTION

The invention relates to an apparatus for controlling or regulating the quality of sound generated by an audio signal by regulating the individual amplitudes of signals in certain predetermined frequency bands.

BACKGROUND OF THE INVENTION

Conventional audio apparatuses such as automobile audio systems, TV units, and audio micro-components are equipped with sound control filter circuits in a signal channel, which is provided for a user to adjust some parameters to enhance, attenuate, or remove certain high and/or low frequency bands of the sound. In these apparatuses, resistors and condensers of the filter circuits occupy large spaces, which hinders integration of the filter circuits into an IC circuit, so that the filter circuits are designed as external components.

An audio system has been disclosed in Japanese Patent Application JP-A-10-233653 for example, which uses switched capacitor (SC) filters substituting for the external sound control filters.

FIG. 1 illustrates a conventional multi-stage sound quality regulation apparatus utilizing SC filters. This sound quality regulation apparatus includes in the audio signal channel thereof a first filter section 1, which comprises: an amplifier 1-1 having an operation amplifier OP, an antialising filter formed of a low-path filter 1-2, a SC filter section 1-3 realized by SC technology, and a voltage setting section (voltage divider) 1-4.

The antialiasing filter 1-2 can be a filter provided in the pre-SC filter stage, adapted to sufficiently and selectively attenuate higher frequency bands exceeding the maximum frequency realized by SC technology. Similarly, a second filter section 2 of the apparatus, provided in the audio signal channel, comprises: an amplifier 2-1 having an operation amplifier OP; an antialising filter 2-2 formed of a low-path filter; an SC filter section 2-3 in the form of a resistor realized by SC technology, and a voltage setting section (voltage divider) 2-4. An appropriate set of such filter sections 1 and 2 is provided in each of the frequency bands to be regulated.

Performance of the sound quality regulation apparatus depends on the characteristics of the filters. Take the first filter section 1 of FIG. 1 for example. The characteristic of the filter is determined by the position of the tap on a voltage divider 1-4. When the tap of the voltage divider 1-4 is set to be short circuited to the output of the amplifier 1-1, the first filter section operates as a voltage follower having a constant amplification factor. In this case, the first filter stays neutral, disconnecting the antialiasing filter 1-2 and the SC filter section 1-3 from the signal channel, so that no noise is supplied from the antialiasing filter 1-2 and the SC filter section 1-3 to the signal channel.

On the other hand, when the tap of the voltage divider 1-4 is positioned so as to divide the output of the amplifier 1-1, the antialiasing filter 1-2 and the SC filter section 1-3 are plugged in the signal channel to change the frequency characteristic of the first filter section. That is, the signal output from the amplifier 1-1 is negatively fed back to the amplifier 1-1 through the antialiasing filter 1-2, SC filter section 1-3, and the voltage divider 1-4.

Thus, the sound quality regulation apparatus as shown in FIG. 1 in the amplification or attenuation modes can amplify or attenuate the audio signal in a given frequency band, or, in the neutral mode, pass the audio signal as it is without adding any noise of the antialiasing filter 1-2 and the SC filter section 1-3.

In the conventional sound quality regulation apparatus, however, each of the frequency bands requires a filter section, so that a series of filter sections are placed in the audio signal channel.

Then, since each stage associated with one frequency band requires an operational amplifier and an antialiasing filter such as a low-pass filter, it is difficult to construct a compact multi-stage sound quality regulation apparatus.

Furthermore, since the multi-stage sound quality regulation apparatus involves as many operational amplifiers OP and filters as the stages in series with the audio signal channel, they add their noises to the signal, thereby disadvantageously decreasing the singnal-noise (S/N) ratio of the signal. Therefore, miniaturization of an audio system equipped with a graphic equalizer for example utilizing as many as 5 to 12 split frequency bands suffers the above mentioned problems if the sound quality must not be sacrificed.

SUMMARY OF THE INVENTION

It is therefore an object of the present invention to provide a compact sound quality regulation apparatus, i.e., a compact tone control apparatus capable of regulating individual split frequency bands of an input audio signal using SC filters and only a few operational amplifiers in the signal channel irrespective of the number of the split frequency bands, thereby increasing the S/N ratio of the apparatus.

In accordance with one embodiment of the invention, a sound quality regulation apparatus has at least one regulation device for regulating the amplitudes of a predetermined number of split frequency bands of an audio input signal, the regulation device comprises:

an attenuation unit which is capable of receiving an input signal and a regulation signal associated with at least one predetermined frequency band, and is adapted to generate an attenuated signal of the input signal which is attenuated in the frequency band based on the regulation signal;

an amplification unit which is capable of receiving the attenuated signal from the attenuation unit and a regulation signal associated with at least one frequency band, and is adapted to generate an output signal which is amplified in the frequency band based on the regulating signal; and at least one sound regulator associated with one frequency band of the input signal, the sound regulator including
a SC filter receiving the attenuated signal from the attenuation unit and permitting the frequency band associated with the sound regulator to pass therethrough as a regulation signal, and
a selection device connected with the SC filter and adapted to selectively feeding the regulation signal to either the attenuation unit, the amplification unit, or none of the units.

The sound quality regulation apparatus can perform attenuation, amplification, or do nothing on the individual frequency bands using the one attenuation unit, one amplification unit, and one or more SC filter(s) associated with the split frequency band(s), or leave the input signal unchanged. Use of such common attenuation unit and amplification unit for the entire split frequency bands along with SC filters enables construction of a very compact sound quality regulation apparatus, irrespective of the number of split frequency bands. Moreover, since the signal channel includes only one common attenuation unit and one common amplification unit, irrespective of the number of split frequency bands, noise sources do not increase if the number of the split frequency bands are increased.

In the sound quality regulation apparatus, the attenuation unit can be formed of:

an adder for adding the input signal and the regulation signal; and an inverting amplifier for inverting and amplifying the output of the adder.

The amplification unit can be formed of:

an adder for adding the attenuated signal and the regulation signal; and an inverting amplifier for inverting and amplifying the output of the adder.

In this way individual attenuation and amplification of the respective frequency bands of an input signal can be performed in a simple manner through addition operations and inversion operations in the two units.

Each of the sound regulators includes, in a pre-SC filter stage thereof an antialiasing filter, and in the post-SC filter stage thereof a smoothing filter and a gain regulator, all connected in series to perform necessary filtering and gain regulation.

The antialiasing filters in the respective sound regulators can be replaced by a single common antialiasing filter providing the attenuated signal to the respective sound regulators.

The attenuation unit of the invention can be formed of: an operational amplifier; a feedback resistor connected between the input and output terminals of the operational amplifier; a first input resistor connected with the inverting terminal of the operational amplifier to receive the input signal; and a second input resistor connected with the inverting terminal of the operational amplifier to receive the regulation signal.

The amplification unit can be formed of: an operational amplifier; a feedback resistor connected between the input and output terminals of the operational amplifier; a first input resistor connected with the inverting terminal of the operational amplifier to receive the attenuated signal; and a second input resistor connected with the inverting terminal of the operational amplifier to receive the regulation signal.

In this arrangement, additions and inversions of signals required in the attenuation and amplification of an audio signal can be performed by a pair of such attenuation unit and an amplification unit, making the sound quality regulation apparatus quite simple in structure.

Each of the sound regulators has in the pre-SC filter stage thereof an antialiasing filter and in the post-SC filter stage thereof a smoothing filter to perform necessary filtering of the signal.

Each of the input resistors receiving a regulation signal can be a variable resistor, which can regulate the gain of the sound regulator without any dedicated gain regulator.

A condenser may be connected in parallel with the feedback resistor of the amplification unit. The condenser serves as a smoothing filter in collaboration with resistors connected with the amplification unit, thereby eliminating need of a dedicated smoothing filter.

BRIEF DESCRIPTION OF THE DRAWINGS

FIGS. 6A and 6B are block diagrams of a second embodiment of a sound quality regulation apparatus according to the invention.

DETAILED DESCRIPTION OF THE PREFERRED EMBODIMENT

Figure 1:
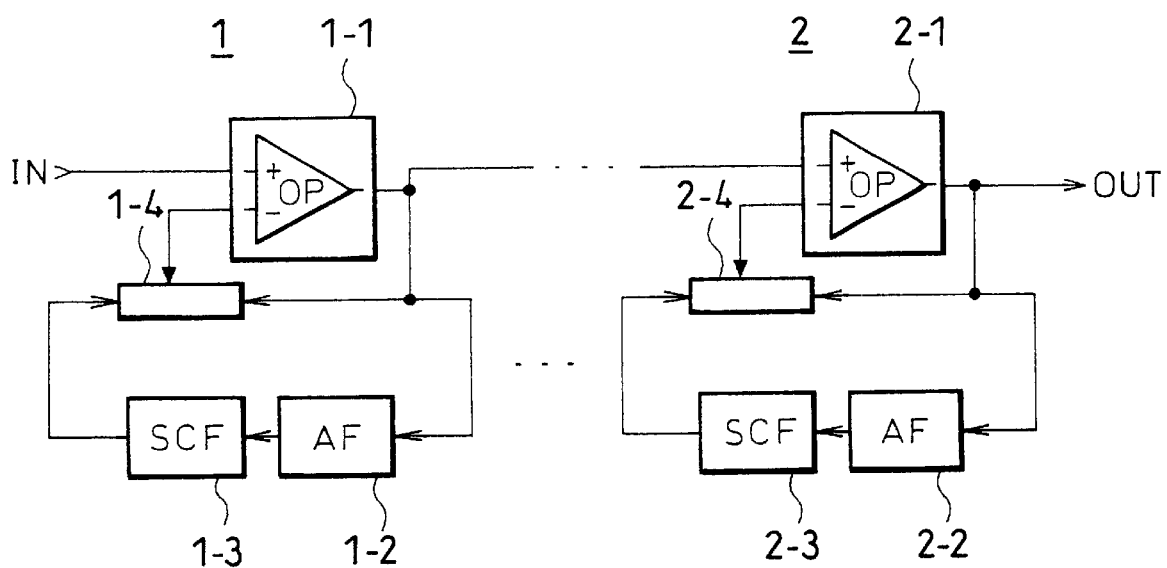
FIG. 1 is a block diagram of a conventional sound quality regulation apparatus.
Figure 2:
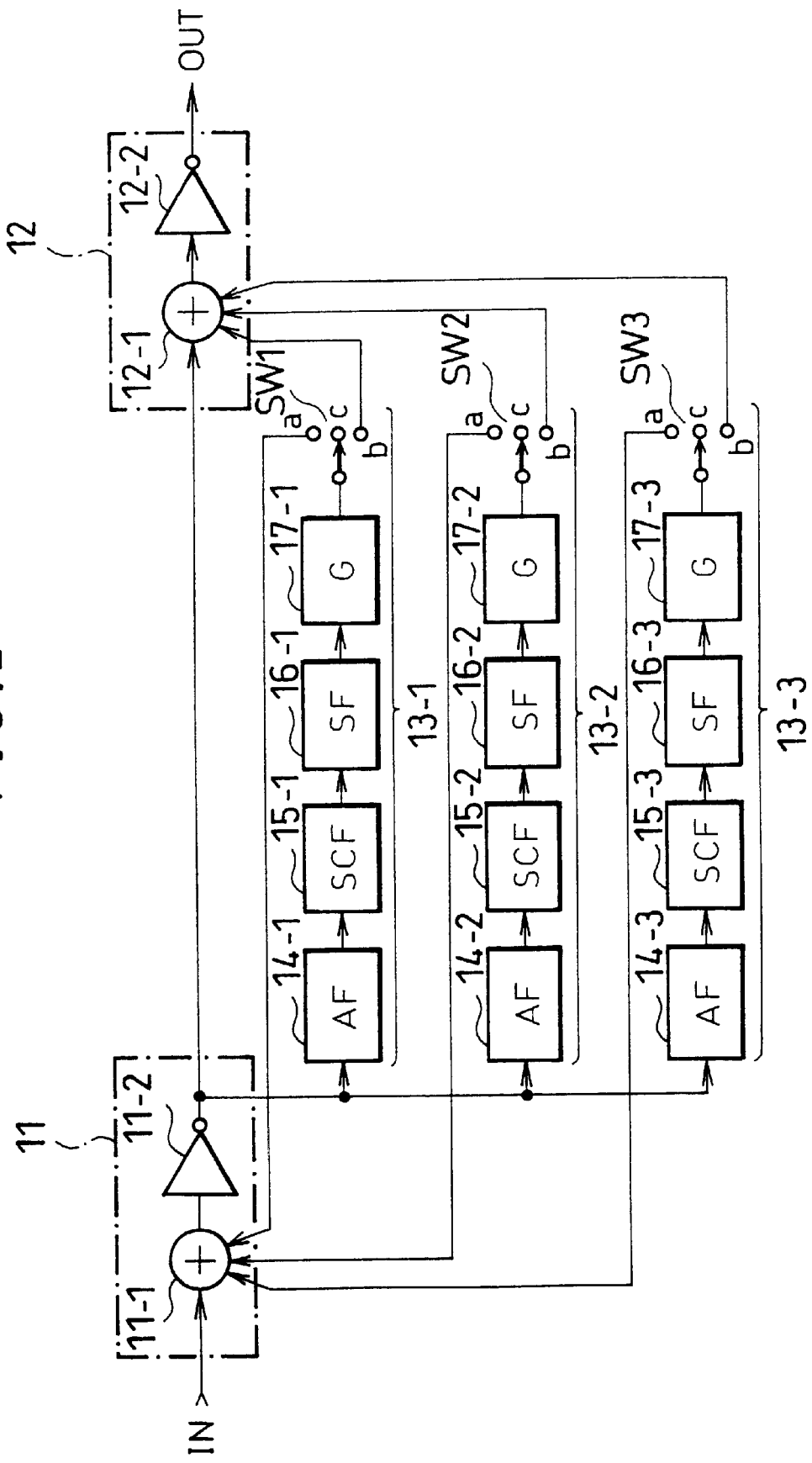
FIG. 2 is a block diagram of a first embodiment of a sound quality regulation apparatus according to the invention.
Figure 3:
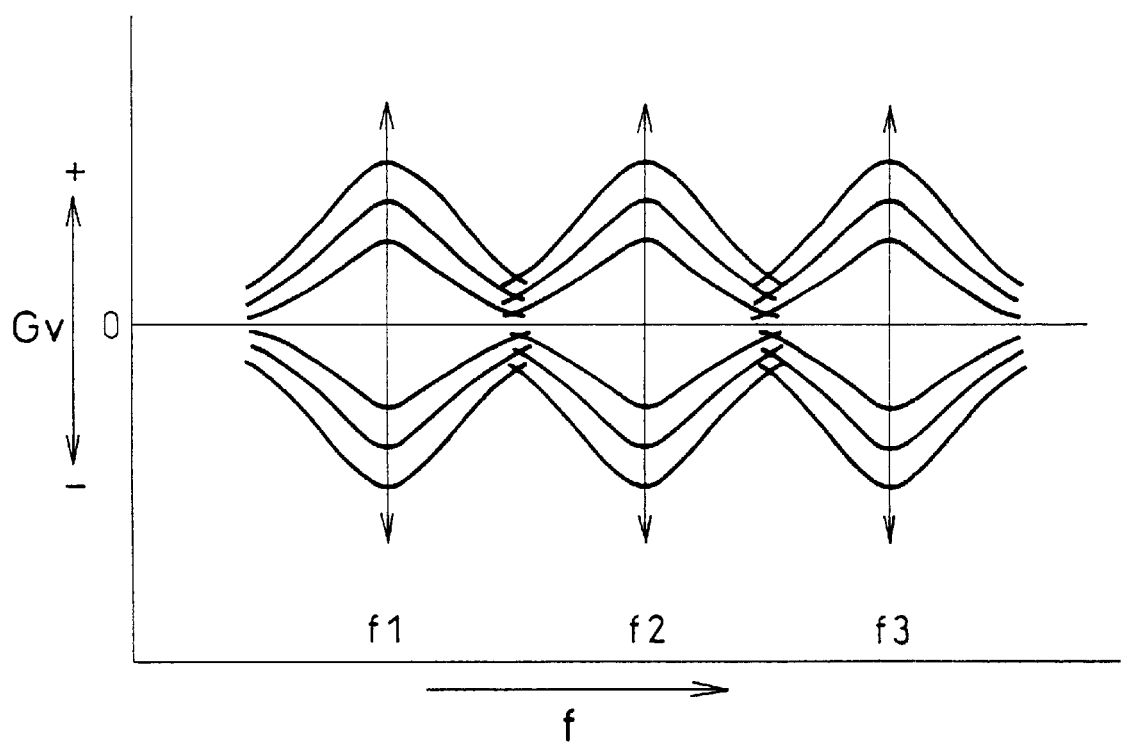
FIG. 3 is a schematic diagram illustrating gain characteristics of the sound quality regulation apparatus in different frequency bands.

FIG. 2 illustrates a first embodiment of the inventive sound quality regulation apparatus. FIG. 3 schematically shows the gain characteristics of the sound quality regulation apparatus in the respective frequency bands. In the example shown herein, an audio signal is split into three frequency bands for the purpose of illustration. It should be understood, however, that the invention is not limited to three split frequency bands, but is applicable to an arbitrary number of split frequency bands.

Although the invention is described with particular reference to a sound quality regulation apparatus for an audio signal, it should be also understood that the invention may well be applied to other types of signals.

Referring now to FIG. 2, there is shown a portion of a signal channel which incorporates therein a sound quality regulation apparatus of the invention, which has an attenuation unit 11 receiving an input audio signal IN to be regulated, and an amplification unit 12, connected in series with the attenuation unit 11, for amplifying the signal received from the attenuation unit 11. The signal channel also has an input circuit (not shown) for providing the attenuation unit 11 with an input signal IN, and an output circuit (not shown) for providing the output signal OUT of the amplification unit 12.

The attenuation unit 11 has an adder 11-1 which adds to the input audio signal IN a regulation signal selected for the attenuation of the associated frequency band. The adder 11-1 outputs the resultant signal via an inverting amplifier 11-2.

The amplification unit 12 has an adder 12-1 for adding the output of the attenuation unit 11 and a regulation signal selected for amplification of associated frequency band. The adder outputs the resultant signal OUT via an inverting amplifier 12-2.

Provided between the attenuation unit 11 and the amplification unit 12 are a multiplicity of sound regulators 13-1, 13-2, and 13-3 for regulating respective bands of the audio signal received from the attenuation unit 11 and supplying the regulated signals (referred to as regulation signals) to either the attenuation unit 11 or the amplification unit 12, or to none of them, in a manner as described in detail below. The number of such sound regulators is shown to be three in the example shown herein, but it will be apparent to a person skilled in the art that there can be more than three in accordance with the number of split frequency bands.

The first regulator 13-1 has an antialiasing filter 14-1, an SC filter 15-1, a smoothing filter 16-1, a gain regulator 17-1, and a selection switch SW1, all connected in series in the order mentioned.

The antialiasing filter 14-1 may be a low-pass filter having a preferred selection characteristic to sufficiently attenuate higher frequency components that exceed the maximum frequency obtained by SC technique.

The SC filter 15-1 can be either a band-pass, a low-pass, and a high-pass filter, which allows a particular band to pass through it. The smoothing filter 16-1 is a low-pass filter adapted to remove any high frequency components that has resulted in by the switching of the SC filter 15-1. The gain regulator 17-1 regulates the level of the regulation signal to be supplied to the attenuation unit 11 and amplification unit 12.

The selection switch SW1 is adapted to select either the attenuation unit 11 (at contact point "a"), amplification unit 12 (at contact point "b"), or nothing (at neutral contact point "c") to which the regulation signal is to be supplied.

The second and the third sound regulators 13-2 and 13-3, respectively, also have the same structure as the first sound regulator 13-1, except that they have all different frequency bands set up by the respective SC filters. Hence, details of the second and the third sound regulators will be omitted.

The operation of the sound quality regulation apparatus will now be described below, with a particular emphasis on the first sound regulator 13-1.

When the selection switch SW1 is thrown to the contact point "a", the regulation signal is fed back to the attenuation unit 11 from the first sound regulator. That is, the regulation signal is fed to the input signal IN in the adder 11-1, which is in turn inverted by the inverting amplifier 11-2 before it is output therefrom.

The output of the inverting amplifier 11-2 is supplied to the antialiasing filter 14-1 of the sound regulator 13-1, where only those components of the input audio signal falling in the frequency band of the sound regulator 13-1 are allowed to pass through the antialiasing filter 14-1, and is regulated by the gain regulator 17-1, resulting in the regulation signal of the sound regulator 13-1.

Thus, the adder 11-1 and the inverting amplifier 11-2 together perform attenuation of the signal in the feed back loop selected by the switch SW1 set to the point "a".

When the selection switch SW1 is thrown to the contact point "b" so that the regulation signal of the sound regulator 13-1 is supplied to the amplification unit 12, the output of the inverting amplifier 11-2 is regulated by the sound regulator 13-1 in a similar way. In this case, however, the regulation signal is supplied via the contact point "b" of the selection switch SW1 to the adder 12-1 of the amplification unit 12 as an amplification regulation signal. The resultant sum signal of the adder 12-1 is inverted and amplified by the inverting amplifier 12-2, resulting in an inverted and amplified output audio signal OUT.

Thus, the signal inverted and amplified by the inverting amplifier 11-2 is partially supplied directly to the amplification unit 12 and partially to the unit 12 via the first sound regulator 13-1, where the two parts are added together in the adder 12-1 and further inverted and amplified by the inverting amplifier 12-2. Hence, an audio signal OUT, amplified and in phase with the input audio signal, is provided from the amplification unit 12-2.

When the selection switch SW1 is thrown to the neutral point "c", the regulation signal of the sound regulator will be supplied to none of the attenuation unit 11 nor the amplification unit 12. In this case, the audio input signal IN which has been inverted and attenuated by the attenuation unit 11 is again inverted and amplified by the amplification unit 12, so that virtually the same signal as the initially input audio signal IN is output from the sound quality regulator. The operations of the second and the third sound regulators 13-2 and 13-3, respectively, are similar to the operation of the sound regulator 13-1 described above.

Therefore, depending on which of the three points chosen by the respective selection switches SW1–SW3, respective split frequency bands of the input signal are enhanced, attenuated, or remain unchanged through the selective operations of the attenuation unit 11 and the amplification unit 12. The degrees of enhancement and the attenuation can be arbitrarily controlled by the respective gain regulators 17-1–17-3.

FIG. 3 schematically illustrates gain (Gv)—frequency (f) characteristics of the respective frequency bands. In the example shown herein, the SC filters 15-1–15-3 are assumed to be band-pass filters. FIG. 3 shows that the respective frequency bands of the input signal can be individually and arbitrarily enhanced, attenuated, or unchanged by appropriately setting the selection switches SW1–SW3 and the gain regulator 17-1–17-3.

Figure 4:
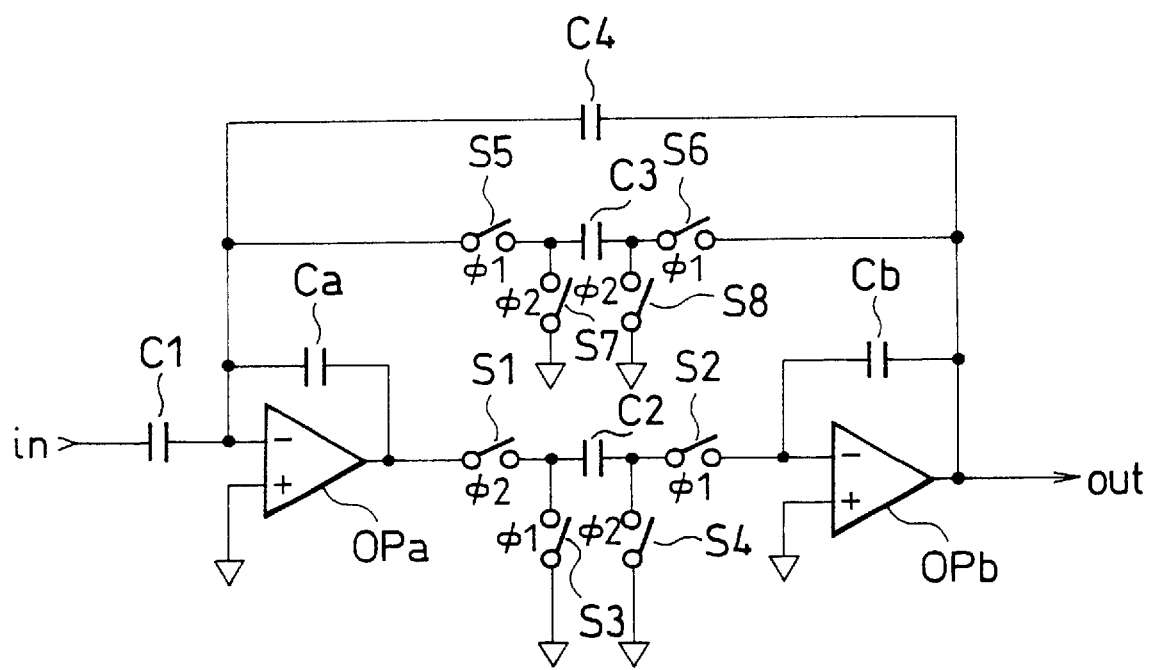
FIG. 4 is a circuit diagram of an exemplary SC filter.
Figure 5A:
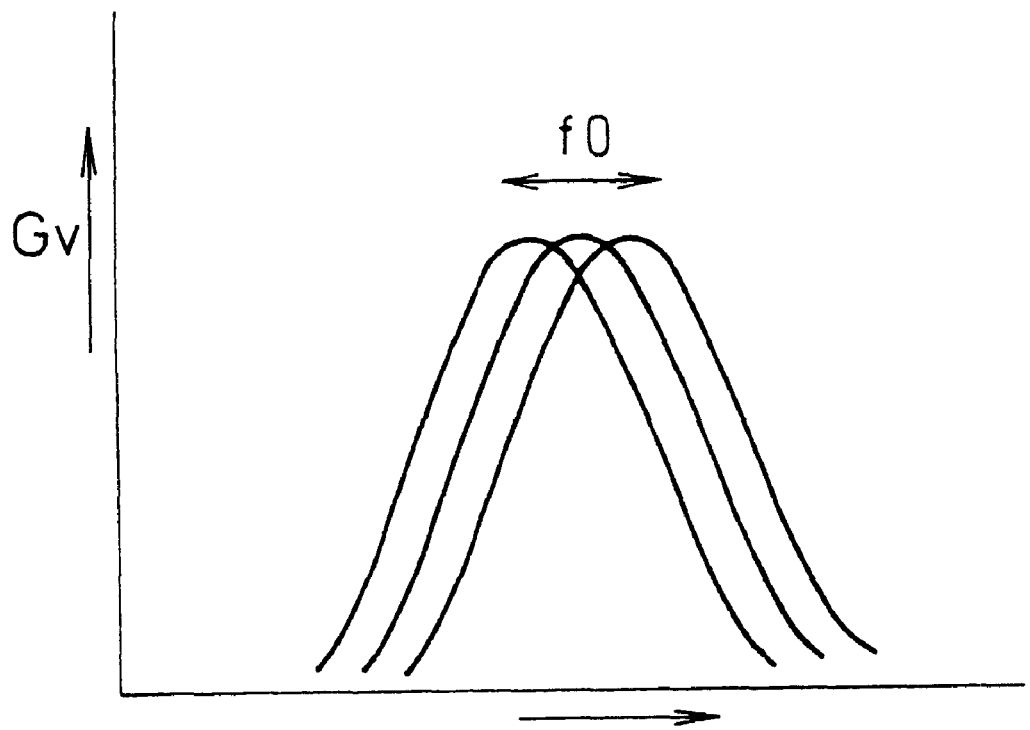
FIGS. 5A and 5B show filtering characteristics of the SC filter of FIG. 4.
Figure 5B:
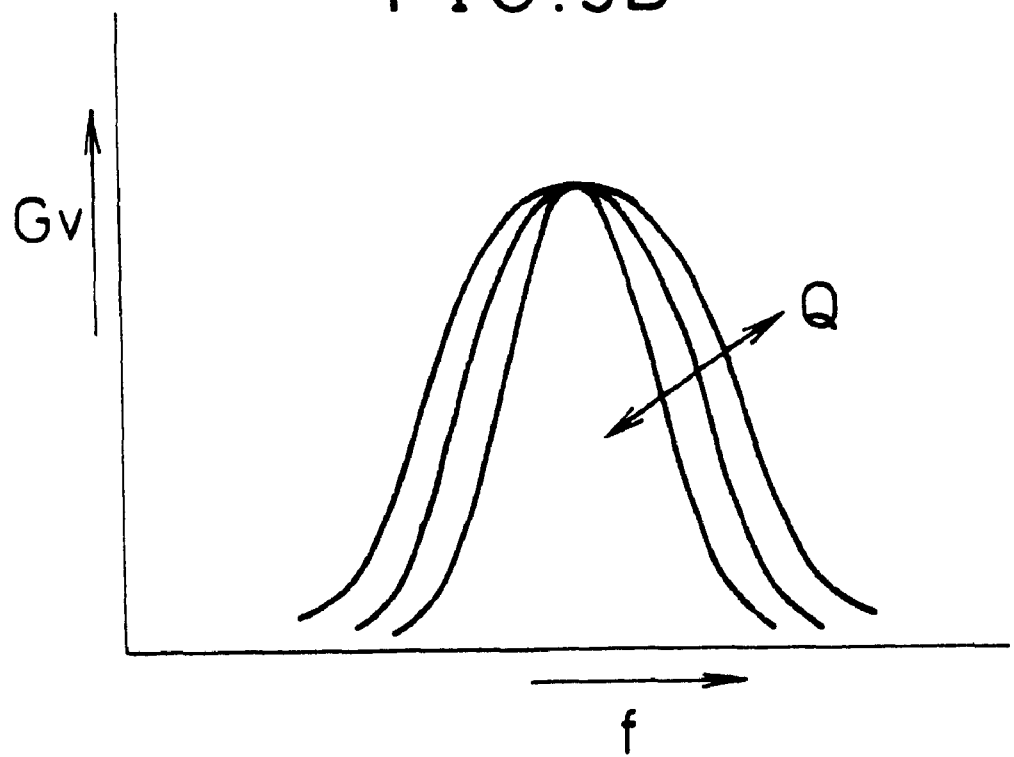

FIG. 4 illustrates a structure of band-pass type SC filter 15, whose frequency characteristics are shown in FIGS. 5A and 5B.

As shown in FIG. 4, the SC filter has a first operational amplifier OPa whose inverting input terminal is adapted to receive the input signal via a condenser C1, and is connected with the output terminal thereof via a condenser Ca. The non-inverting input terminal of the operational amplifier OPa is coupled to a reference potential. The SC filter also has a second operational amplifier OPb whose inverting input terminal is coupled with the output terminal of the first operational amplifier OPa via a switch S1, a condenser C2, and another switch S2, and is connected with its output terminal via a condenser Cb. The non-inverting input terminal is connected with the reference potential. The condenser C2 is also connected at the opposite ends thereof with the reference potential via respective switches S3 and S4. Another condenser C4 is connected between the inverting input terminal of the first operational amplifier OPa and the output terminal of the second operational amplifier OPb. A further condenser C3 is connected between the two terminals via a switch S5 and a switch S6 on the opposite ends of the condenser C3. The condenser C3 is further connected at the opposite ends thereof with the reference potential via respective switches S7 and S8.

The switches S2, S3, S5, and S6 are driven by a clock signal $\phi 1$, while the switches S1, S4, S7, and S8 are driven by a clock signal $\phi 2$. These clock signals $\phi 1$ and $\phi 2$ are configured to be complementary in that they do not overlap each other while they are both at HIGH level (during the switches are switched on).

Desired filter characteristics of the SC filter 15 are obtained by operating the switches S1 through S8 by the clock signals $\phi 1$ and $\phi 2$. The filter characteristics may be regulated as desired. For example, the center frequency f0 may be shifted to a higher frequency or to a lower frequency, as shown in FIG. 5A, by increasing or decreasing the capacitances of the condensers C2 and C3. By increasing or decreasing the capacitances of the condensers C1 and C4, the selectivity Q of the SC filter may be increased or decreased, as shown in FIG. 5B.

Thus, in accordance with the first embodiment of the sound quality regulation apparatus, each of the split frequency bands of an input audio signal may be individually enhanced or attenuated (removed), or unchanged using the respective sound regulators in combination with the respective switches. It will be appreciated that a common attenuation unit 11 and a common amplification unit 12 of the sound quality apparatus can be effected together with SC filters for an arbitrary number of split bands, in a very compact form.

It will be also appreciated that the common attenuation unit 11 and the common amplification unit 12 help prevent extra noise sources from coming into the signal channel, irrespective of the number of the frequency bands, thereby minimizing distortions of the signal.

Furthermore, when a sound regulator 13 is set neutral for a given frequency band, the antialiasing filter 14 and the SC filter 15 in the sound regulator are put away from the signal channel, so that noise will be further reduced in the relevant frequency band.

A semiconductor IC device utilizing an inventive sound quality apparatus has a reduced or miniaturized size and requires no external filter element. Such miniaturized devices may be advantageously applied to an automobile audio set, a TV set, and a microcomponent audio set installed in a limited space.

FIG. 6A illustrates a second embodiment of a sound quality regulation apparatus of the invention and FIG. 6B illustrates a structure of its amplification unit 22.

Compared with the first embodiment shown in FIG. 2, this embodiment is provided with a common antialiasing filter 24 for multiple sound regulators in place of individual antialiasing filters 14-1–14-3, as shown in FIGS. 6A and 6B. The output of the attenuation unit 11 is thus fed to the respective SC filters 15-1–15-3 via the common antialiasing filter 24. This embodiment is based on the fact that the antialiasing filters of FIG. 2 can be integrated to a single low-pass filter because they are low-pass filters provided in pre-stages of the respective SC filters. It should be appreciated that the integration of the antialiasing filters into the common antialiasing filter 24 is only possible by providing the multiple sound regulators in a parallel arrangement according to the invention.

In the second embodiment shown in FIGS. 6A and 6B, the amplification unit 22 supersedes the smoothing filters 16-1–16-3 of the first embodiment shown in FIG. 2. This can be done by the following modification of the amplification unit 22.

In this arrangement, the amplification unit 22 has an operational amplifier having its inverting input terminal coupled with an input resistor Rs22 for attenuating the input signal, and with the output terminal thereof via a feedback resistor Rf22 and a condenser Cf22 which is parallel to the resistor Rf22, so that the amplification unit 22 now serves as a low-pass filter, requiring no further smoothing filter. The inverting input terminal of the operational amplifier OP22 is also connected with three resistors Ra22-1–Ra22-3 which are in turn connected with the respective contact points "b"s of the respective selection switch SW1–SW3. The non-inverting input terminal of the operational amplifier OP22 is coupled to the reference potential. The rest portions of FIG. 6A and the first embodiment of FIG. 2 are the same in structure, and further detailed description of these portions will be omitted.

Figure 7:
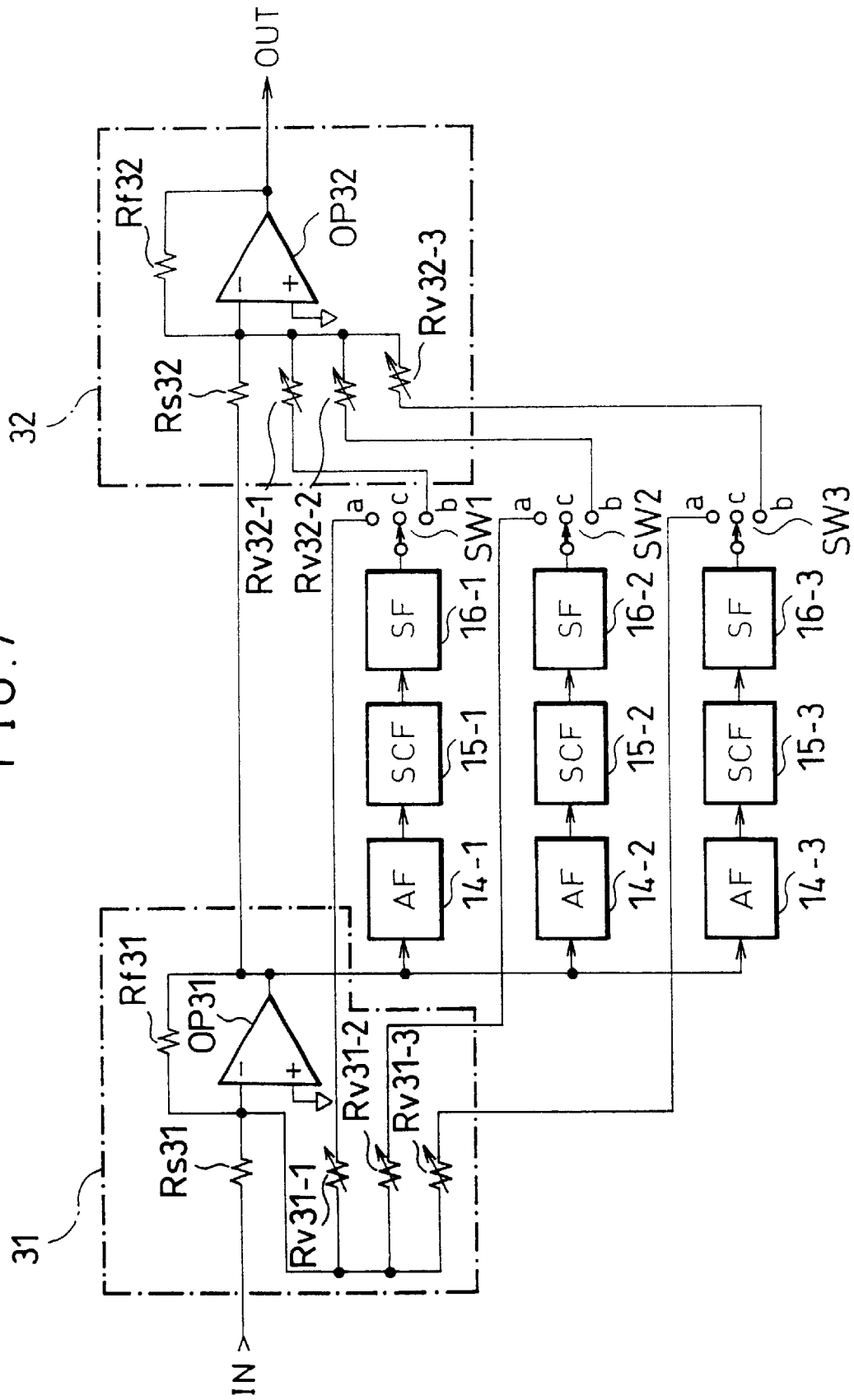
FIG. 7 is a block diagram of a third embodiment of a sound quality regulation apparatus according to the invention.

FIG. 7 illustrates a third embodiment of a sound quality regulation apparatus according to the invention. In this embodiment, an attenuation unit 31 and an amplification unit 32 together supersede the gain regulators 17-1–17-3 of FIG. 2. The rest portions having like or corresponding reference numerals in FIG. 2 and FIG. 7 are the same.

As shown in FIG. 7, an attenuation unit 31 has an operational amplifier OP31 which receives at its inverting input terminal an audio signal via an input resistor Rs31. The inverting input terminal is connected with its output terminal via a feedback resistor Rf31. The attenuation unit 31 also includes three variable resistors Rv31-1–Rv31-3, which are each connected at one end thereof with the inverting input terminal of the operational amplifier OP31 and at the other end with the respective contact points "a"s of the respective selection switch SW1–SW3. The non-inverting input terminal of the operational amplifier OP31 is coupled to the reference potential. The operational amplifier 31 may function as a gain regulator by varying the resistances of the variable resistors Rv31-1–Rv31-3.

Similarly, the amplification unit 32 has an operational amplifier OP32 having an inverting input terminal to receive an attenuated signal via an input resistor Rs32. The inverting input terminal is also connected with the output terminal with a feedback resistor Rf32. The inverting input terminal is further connected with three variable resistors Rv32-1–Rv32-3, which are in turn connected with the respective contact points "b"s of the selection switch SW1–SW3. The non-inverting input terminal of the operational OP32 is coupled to the reference potential. The operational amplifier OP32 may function as a gain regulator by varying the resistances of the variable resistors Rv32-1–Rv32-3.

As in the second embodiment shown in FIG. 6, the antialiasing filters 14-1–14-3 may be substituted for by a common antialiasing filter. The smoothing filters may be removed by providing the amplification unit 32 with the smoothing function.

It will be understood that the second and the third embodiments can attain the same merits as the first embodiment, in a more compact form.

What we claim is:

1. A sound quality regulation apparatus for regulating split frequency bands of an input signal, comprising:

an attenuation unit which is capable of receiving an input signal and a regulation signal associated with at least one predetermined frequency band, and is adapted to generate an attenuated signal of said input signal which is attenuated in said frequency band based on said regulation signal;

an amplification unit which is capable of receiving said attenuated signal from said attenuation unit and a regulation signal associated with at least one frequency band, and is adapted to generate an output signal which is amplified in said frequency band based on said regulating signal; and at least one sound regulator associated with one frequency band of said input signal, said sound regulator including
    a SC filter receiving said attenuated signal from said attenuation unit and permitting the frequency band associated with said sound regulator to pass therethrough as a regulation signal, and
    a selection device connected with said SC filter and adapted to selectively feeding said regulation signal to either said attenuation unit, said amplification unit, or none of said units.

2. The sound quality regulation apparatus according to claim 1, wherein said attenuation unit is formed of:

an adder for adding said input signal and said regulation signal; and an inverting amplifier for inverting and amplifying the output of said adder, and wherein said amplification unit is formed of:

an adder for adding said attenuated signal and said regulation signal; and an inverting amplifier for inverting and amplifying the output of said adder.

3. The sound quality regulation apparatus according to claim 2, wherein said at least one sound regulator includes in a pre-SC filter stage thereof an antialiasing filter, and in a post-SC filter stage thereof a smoothing filter and a gain regulator, all connected in series.

4. The sound quality regulation apparatus according to claim 2, further comprising a single common antialiasing filter providing said attenuated signal to said at least one sound regulator.

5. The sound quality regulation apparatus according to claim 1, wherein said attenuation unit is formed of:

an operational amplifier;

a feedback resistor connected between the input and output terminals of said operational amplifier;

a first input resistor connected with the inverting terminal of said operational amplifier to receive said input signal; and a second input resistor connected with the inverting terminal of said operatonal amplifier to receive said regulation signal, and wherein said amplification unit is formed of:

an operational amplifier;

a feedback resistor connected between the input and output terminals of said operational amplifier;

a first input resistor connected with the inverting terminal of said operational amplifier to receive said attenuated signal; and a second input resistor connected with the inverting terminal of said operational amplifier to receive said regulation signal.

6. The sound quality regulation apparatus according to claim 5, wherein said second input resistor for receiving said regulation signal is a variable resistor.

7. The sound quality regulation apparatus according to claim 6, wherein said at least one sound regulator has in the pre-SC filter stage thereof an antialiasing filter, and in the post-SC filter stage thereof a smoothing filter.

8. The sound quality regulation apparatus according to claim 5, further comprising a single common antialiasing filter providing the output of said attenuation unit to said at least one sound regulator.

9. The sound quality regulation apparatus according to claim 5, further comprising a condenser connected in parallel with said feedback resistor of said amplification unit.

* * * * *